(12) United States Patent
Goida (10) Patent No.: US 7,829,379 B2
(45) Date of Patent: Nov. 9, 2010

(54) WAFER LEVEL STACKED DIE PACKAGING

(75) Inventor: Thomas M. Goida, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 491 days.

(21) Appl. No.: 11/874,083

(22) Filed: Oct. 17, 2007

(65) Prior Publication Data

US 2009/0102060 A1    Apr. 23, 2009

(51) Int. Cl.
H01L 21/00    (2006.01)

(52) U.S. Cl. .................. 438/107; 438/113; 438/118; 257/777; 257/E21.614

(58) Field of Classification Search ............... 438/107, 438/110, 113, 118; 257/686, 783, 777, E23.127, 257/E25.013, 778, E21.499, E21.503, E21.522, 257/E21.599, E21.614, E21.705
See application file for complete search history.

(56) References Cited

U.S. PATENT DOCUMENTS

| | | | | |
|---|---|---|---|---|
| 3,851,221 A | 11/1974 | Beaulieu et al. | ............. | 317/100 |
| 4,103,318 A | 7/1978 | Schwede | ............ | 361/388 |
| 4,361,261 A | 11/1982 | Elles et al. | ............ | 228/102 |
| 4,444,349 A | 4/1984 | Bilane et al. | ............ | 228/102 |
| 4,567,643 A | 2/1986 | Droguet et al. | ............. | 257/777 |
| 4,586,642 A | 5/1986 | Dreibelbis et al. | ............ | 228/4.5 |
| 4,730,232 A | 3/1988 | Lindberg | ............ | 361/381 |
| 4,763,188 A | 8/1988 | Johnson | ............ | 257/777 |
| 4,982,265 A | 1/1991 | Watanabe et al. | ............ | 357/75 |
| 5,025,306 A | 6/1991 | Johnson et al. | ............ | 357/75 |
| 5,026,667 A | 6/1991 | Roberts, Jr. | ............ | 437/209 |
| 5,040,052 A | 8/1991 | McDavid | ............ | 357/80 |
| 5,140,404 A | 8/1992 | Fogal et al. | ............ | 357/70 |
| 5,172,215 A | 12/1992 | Kobayashi et al. | ............ | 257/724 |
| 5,176,311 A | 1/1993 | Levine et al. | ............ | 228/179 |
| 5,177,032 A | 1/1993 | Fogal et al. | ............ | 437/220 |
| 6,492,699 B1 * | 12/2002 | Glenn et al. | ............ | 257/433 |
| 6,649,446 B1 | 11/2003 | Goetz et al. | ............ | 438/110 |
| 6,661,083 B2 | 12/2003 | Lee et al. | ............ | 257/676 |

(Continued)

FOREIGN PATENT DOCUMENTS

JP    63-126661    6/1987

(Continued)

OTHER PUBLICATIONS

Balde et al., "*Thin Film Multichip Modules*".

(Continued)

*Primary Examiner*—Evan Pert
*Assistant Examiner*—Leslie Pilar Cruz
(74) *Attorney, Agent, or Firm*—Sunstein Kann Murphy & Timbers LLP (57) ABSTRACT

A method of manufacturing semiconductor devices by applying a pattern of adhesive pads on an active surface of a semiconductor wafer, the semiconductor wafer product so made and a stacked die package in which an adhesive wall leaves an air gap atop a bottom die. The wall may be in the form of a ring of adhesive about a central hollow area. The wafer carrying the pattern of adhesive pads on its active surface is singulated into individual dies, each die having an adhesive pad thereon. The bottom die is attached to a base with an adhesive which cures without curing the adhesive pad.

14 Claims, 6 Drawing Sheets

U.S. PATENT DOCUMENTS

| | | | |
|---|---|---|---|
| 6,759,307 B1 | 7/2004 | Yang | 438/455 |
| 6,894,380 B2 | 5/2005 | Jiang et al. | 257/686 |
| 6,933,172 B2 | 8/2005 | Tomimatsu | 438/109 |
| 7,022,418 B2 | 4/2006 | Connell et al. | 428/621 |
| 7,180,181 B2 | 2/2007 | Liu et al. | 257/724 |
| 2002/0037631 A1 | 3/2002 | Mimata | 438/460 |
| 2002/0090753 A1 | 7/2002 | Pai et al. | 438/108 |
| 2002/0140073 A1 | 10/2002 | Pai et al. | 257/686 |
| 2002/0163015 A1 | 11/2002 | Lee et al. | 257/200 |
| 2005/0040514 A1 | 2/2005 | Lee et al. | 257/701 |
| 2005/0224959 A1* | 10/2005 | Kwon et al. | 257/723 |
| 2005/0277268 A1* | 12/2005 | Hoshika | 438/457 |
| 2007/0200944 A1 | 8/2007 | Takeuchi et al. | 348/294 |

FOREIGN PATENT DOCUMENTS

| | | |
|---|---|---|
| JP | 63-128736 | 6/1988 |
| JP | 63-244654 | 10/1988 |
| JP | 4-56262 | 2/1992 |

OTHER PUBLICATIONS

Schuckert, et al., "Polyimide Stress Buffers in IC Technology," *IEEE Advanced Semiconductor Manufacturing Conference*, 1990, pp. 72-74.

European Patent Office; Authorized Officier Cortes Rosa, J., *International Search Report and the Written Opinion of the International Searching Authority*, PCT/US2008/078778, dated Aug. 25, 2009, 10 pages.

* cited by examiner

WAFER LEVEL STACKED DIE PACKAGING

BACKGROUND OF THE INVENTION

The present invention relates to stacked microelectronic devices and methods of manufacturing the same.

Stacked die packaging typically comes in any of three forms: pyramid configuration, inverted pyramid configuration and same size die configuration. In a pyramid configuration the top die is smaller than the bottom die. The opposite is true in the inverted pyramid configuration. Alternatively, the dies can be the same size. In all stacked die configurations, an adhesive is typically applied to attach the top and bottom die together. In the case of the inverted pyramid with a larger die on top, the inclusion of a spacer is often required which introduces two separate and additional die attach steps in package assembly processes. Spacers are made from several different types of materials that include silicon and polymer based pre-defined tapes. Electrical connections are provided by bonding electrodes on the dies to wires for connection to the base.

SUMMARY OF THE INVENTION

In accordance with embodiments of the invention, a stacked die package includes at least two microelectronic semiconductor dies, one affixed on top of the other. An adhesive wall atop the bottom die outlines an air gap between a bottom and top die. In one embodiment, the adhesive wall is in the shape of a rectangle and forms a perimeter about a hollow area centrally disposed above the die. In other embodiments, the adhesive wall may be C-shaped, V-shaped, H-shaped or X-shaped to name a few configurations. The top die is affixed on the adhesive wall to create the stacked dies. In a specific embodiment, the adhesive wall provides a thickness between the dies in a ratio of at least 1:1 with the width of the wall. The stacked dies are mounted on a base. Wire bonds connect atop surface of each of the dies to the base. The stacked die package can be encased within a non-conductive material molded over the first and second semiconductor dies. The package may further include conductive balls attached to a bottom surface of the base for facilitating electrical connections.

In accordance with a method of manufacturing, a pattern of adhesive pads is deposited on the active surface of a semiconductor wafer. Among the possible adhesive patterns are an array of rings of adhesive or an array of geometrically shaped solid blocks of adhesive. The wafer is thereafter singulated to separate it into individual first semiconductor dies, each die having an adhesive pad thereon. A rear surface of each first semiconductor die can be attached to a base. Wire bonding may be performed between the first semiconductor die and its respective base. A second semiconductor die is attached atop the adhesive pad onto the first semiconductor die to form a stacked die package. Wire bonding may be further performed to electrically attach the second semiconductor die to the base. Overmolding the first and second semiconductor die stacks with non-conductive materials encases the individual packages. In a preferred embodiment, the wafer may be backgrinded before the deposit of a pattern of adhesive. The method may further include partially curing the adhesive before singulating the wafer.

Stress on the die surface of the underlying die typically imparted by the adhesive layer is reduced by using only an adhesive wall leaving an adhesive free air gap region. Application of the adhesive to the active surface of the semiconductor wafer provides for an efficient manufacturing process.

Other objects and advantages of the invention will become apparent during the following description of the presently preferred embodiments of the invention taken in conjunction with the drawings.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

In order to make a stacked die package in a mass production method, a starting material may be a semiconductor wafer as is well known in the art. The typical semiconductor wafer is made from silicon. An array of microelectronic circuits is formed on the semiconductor wafer. Typically, the array of circuits is formed in rows and columns of individual microelectronic circuits. The semiconductor wafer includes an active surface onto which wire connections can be made and a rear surface for mounting. When thickness is an issue, a backgrinding process may be performed on the wafer bearing the circuits to make it and, thus, the resulting dies thinner.

Figure 9:
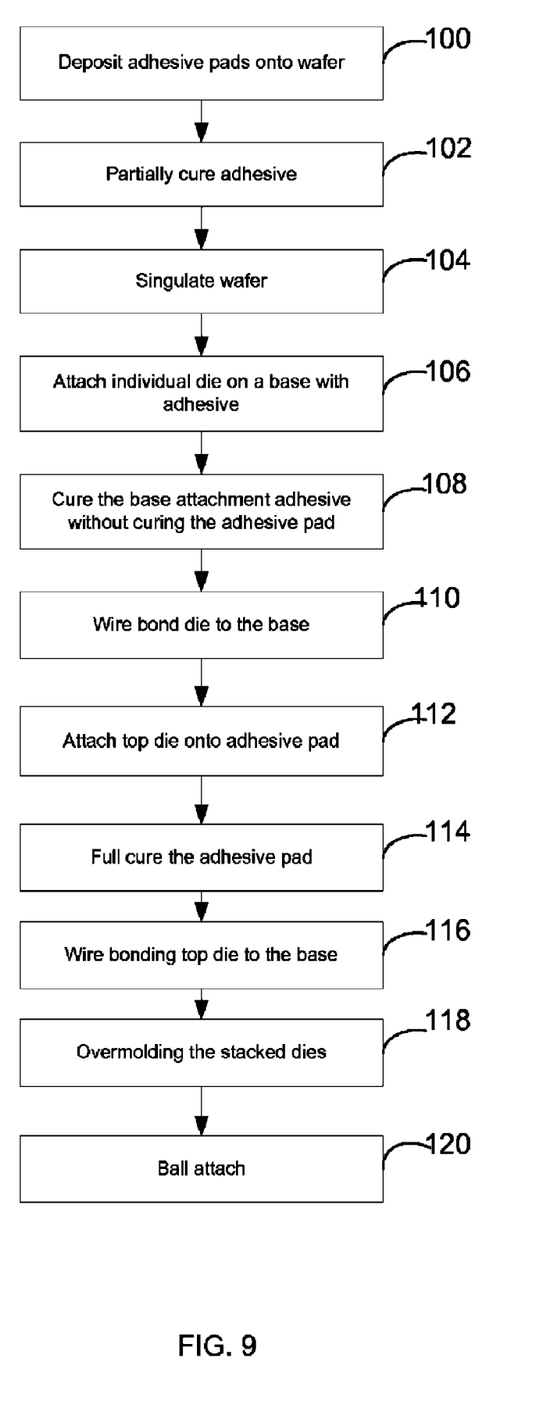
FIG. 9 is a flowchart diagram of an embodiment of the invention of a method for making stacked dies.

In accordance with an aspect of the present invention as seen in FIG. 9, adhesive pads 11a, 11b are deposited 100 onto the active surface of the semiconductor wafer wherein each adhesive pad 11a, 11b is aligned with one of the individual microelectronic circuits. The adhesive pad 11a, 11b is an amount of adhesive having a thickness such that it will advantageously act as a spacer between a bottom die and top die of a package.

The adhesive pads may be applied to the wafer in any of a number of methods. Such methods include screen printing or photolithography. The adhesive material may be selected from any of a number of adhesives suitable for use in making microelectronic components. Such adhesives may include, for example, polyimide or BCB (benzocyclobutene). The thickness of the adhesive to be used as a spacer depends upon the geometrical features of the silicon die for a given packaging application. For a stacked die in which the smaller die is placed on top, a smaller thickness spacer is acceptable, for example, in the range of 5 to 20 microns. In an embodiment in which a larger die is placed on top of the smaller die to form a stacked package the thickness of the adhesive may be, for example, between 50 and 75 microns. Such a thick adhesive pad may be more suitable for application through a screen printing method. The method and products of the present invention may be used with any thickness adhesive pad that can be used to produce a useable device.

Figure 1A:
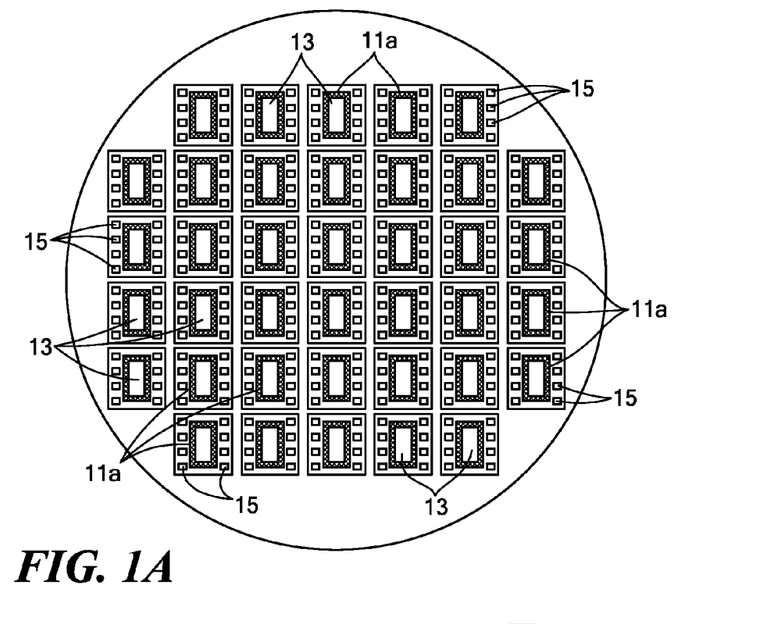
FIGS. 1A and 1B are plan views of an intermediate semiconductor product in accordance with embodiments of the invention.

In accordance with one embodiment as shown in FIG. 1A, the adhesive pads 11a, are rings of adhesive. The adhesive forms a wall that leaves a hollow area 13 centrally disposed above each die as shown in FIG. 1A. This hollowed out central portion 13 leaves an air gap that will thus not stress the bottom die in a manner normally associated with the adhesive. Spacers based on organic material can induce thermo-mechanical shear stress on the top side of the bottom silicon die in a stacked die package. The magnitude of this shear stress will depend on the material properties, geometry of the spacer and interface adhesion area. This shear stress has potential to cause delamination and/or cracking in die passivation and/or inner layer structures inside the silicon die. The adhesive rings reduce the adhesion area and are thus designed to reduce these shear stresses. The adhesive acts as a wall that forms the perimeter about the hollow central portion. In the embodiment of FIG. 1A, the ring of adhesive is in the shape of a rectangle. It is contemplated that in specific embodiments, a minimal aspect ratio for thickness (height) of the wall to width of the wall should be 1 to 1. The actual aspect ratio of the adhesive wall will depend upon the geometrical features of the bottom die and type of application. Such walls may be used to create pads in shapes other than a ring that still create an air gap and derive similar advantages of reduced stress. Such shapes are innumerable including C-shaped, H-shaped, V shaped or X-shaped among others.

Figure 1B:
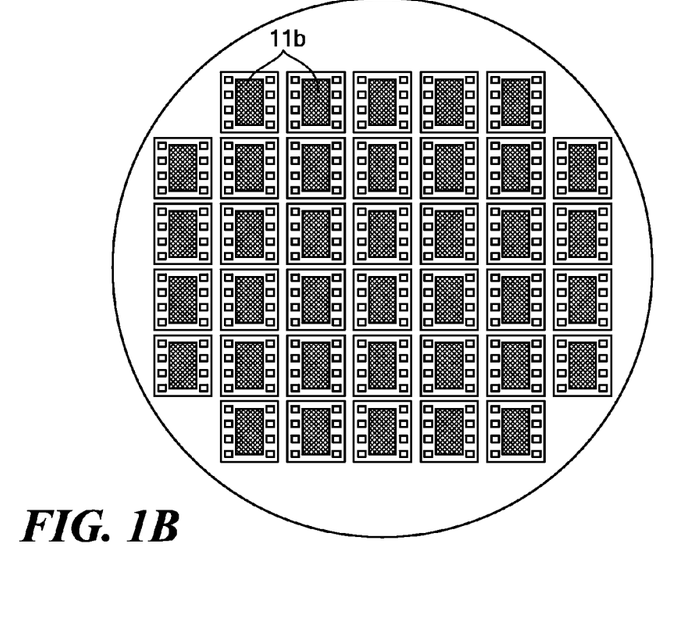

In accordance with an alternative embodiment such as that shown in FIG. 1B, the adhesive pads 11b are geometrically shaped as solid blocks of adhesive. The shape shown in FIG. 1B is that of a rectangular block of adhesive. Certainly, an oval or other shapes may be used as well.

In accordance with a preferred embodiment, each adhesive pad is oriented over a microelectronic circuit but within boundaries set by bond pads 15 for use along the periphery of a die. Thus, the bond pads 15 for the microelectronic circuit are exposed and accessible outside the periphery of the adhesive pad. Once the adhesive pads have been deposited, an intermediate semiconductor product has been completed for further use in the manufacturing of stacked die packaging.

Figure 2:
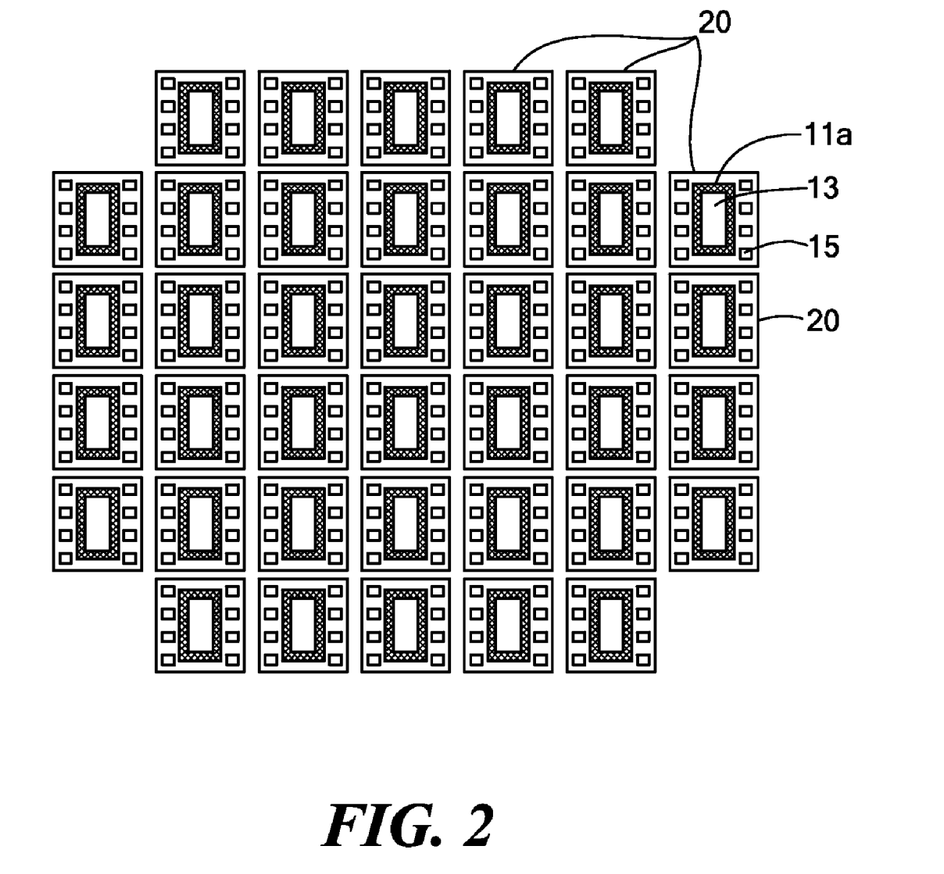
FIG. 2 is a schematic plan view of the product of FIG. 1A after singulation into individual dies.

The method of manufacture continues with the step of partially curing 102 the adhesive to bring it to its B-stage. B-stage is an intermediate stage in a thermosetting resin reaction in which the plastic remains in a soft state. The intermediate semiconductor product is then ready for singulation. The singulation process 104 typically involves sawing the wafer into individual dies 20 as shown in FIG. 2. Each die 20 includes a microelectronic circuit and the adhesive pad 11a, 11b that had been deposited thereon.

Figure 3:
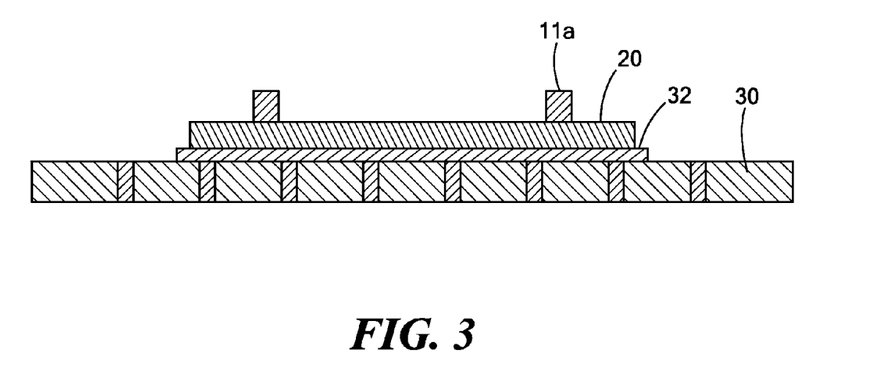
FIG. 3 is a schematic side elevational view of a single die after attachment to a base.

The individual dies may then be picked and placed onto a base 30. A suitable pickup nozzle is used to accommodate the circuit with adhesive pad thereon. A snap cure or low temperature curing adhesive 32 on the base 30 attaches 106 the bottom of the die 20 to the base. The base 30 may be a substrate or lead frame or other suitable base for supporting a stacked die package. The snap cure or low temperature curing adhesive 32 may then be cured without fully curing the adhesive pad 11a, 11b on the die 20. The curing may take place at a lower temperature than will cure the adhesive pad or the curing can take place in a short time span such that the adhesive pad does not cure. Standard die attach materials, such as ABLESTIK 84-1, are cured at temperatures well below full cure for adhesives such as polyimide or BCB. For example, a die attach material might be cured at temperatures between 125° C. and 150° C. for approximately one hour. The BCB or polyimide used for the adhesive pad may, on the other hand, cure at over 300° C. for more than 30 minutes to an hour.

Figure 4:
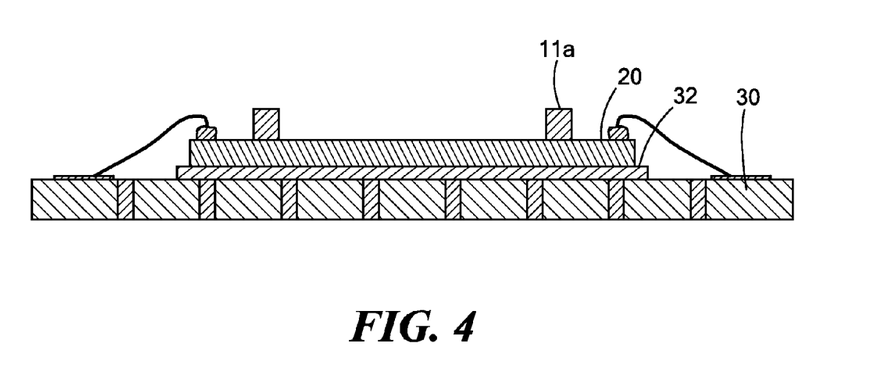
FIG. 4 is a schematic side elevational view of the die of FIG. 3 after wire bonding.

After attaching the bottom die to the base, the adhesive attaching the die to the base is cured without curing the adhesive pad 108. Thus, the adhesive pad may remain in its B-stage during this low temperature or quick curing. At this point, wire bonding 110 can be performed to connect bond pads on the bottom die to the base, as shown in FIG. 4.

Figure 5:
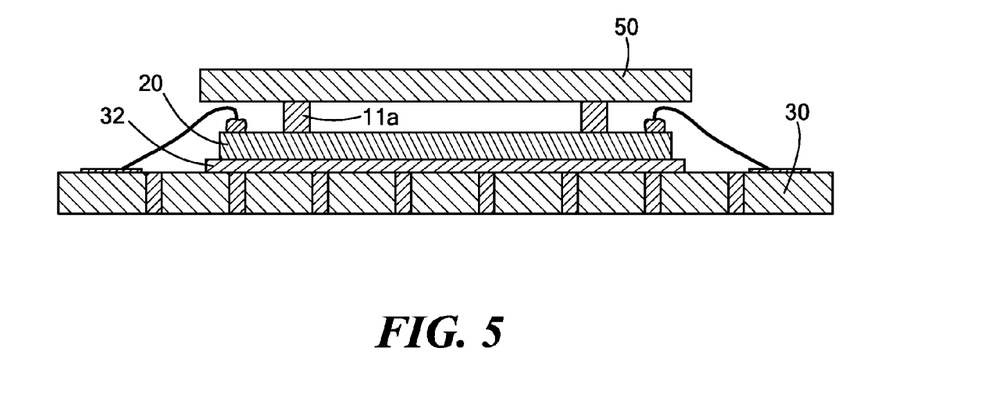
FIG. 5 is a schematic side elevational view of the die of FIG. 4 after attachment of the top die.
Figure 6:
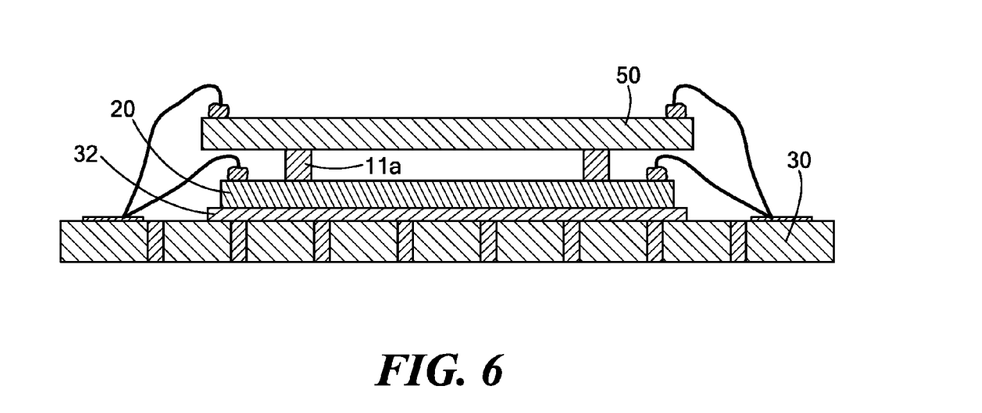
FIG. 6 is a schematic elevational view of the stacked dies of FIG. 5 after wire bonding of the top die.
Figure 7:
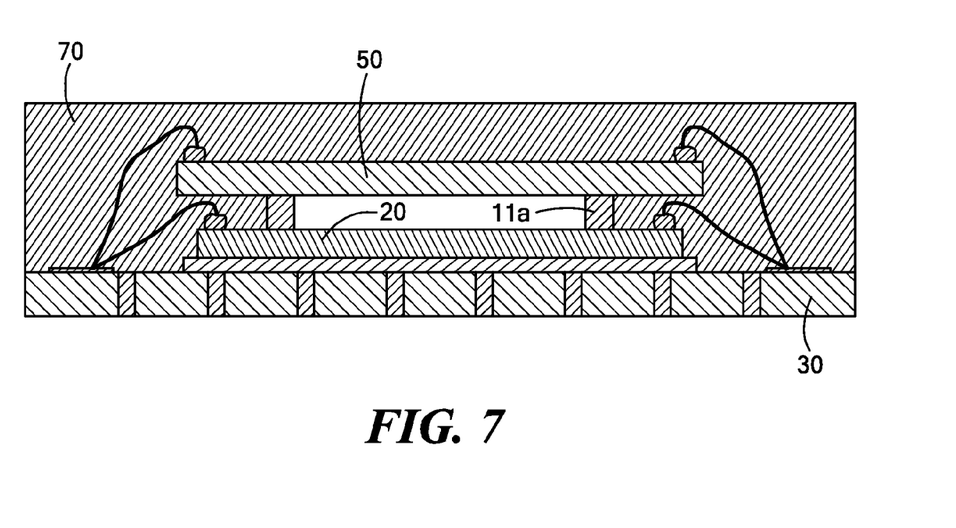
FIG. 7 is a schematic side elevational view of the stacked dies of FIG. 6 after overmolding.
Figure 8:
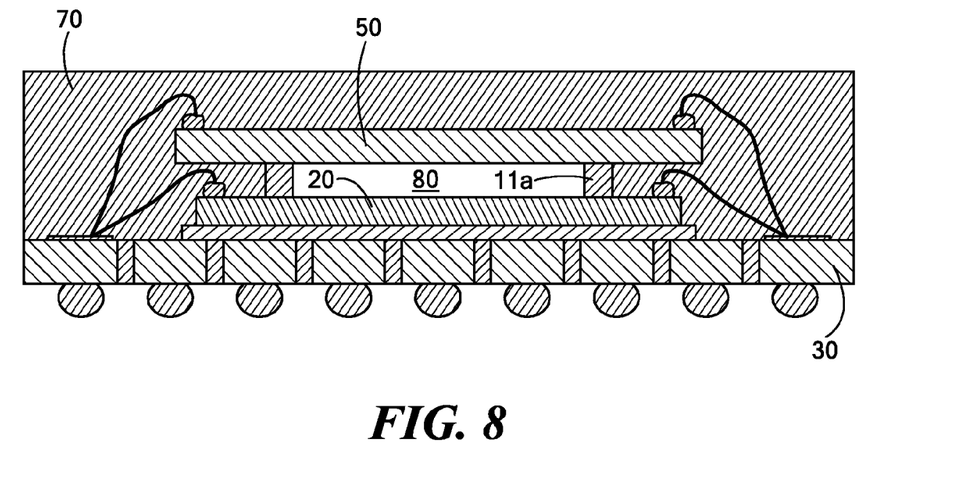
FIG. 8 is a schematic side elevational view of the stacked dies of FIG. 7 after ball attachment.

A top die 50 is then ready for attachment 112 above the bottom die 20. The top die 50 is placed on the adhesive pad 11a, 11b as shown in FIG. 5. Full curing 114 of the B-stage adhesive pad is then performed to securely attach the bottom and top dies of the stacked die package. Wire bonding 116 may then be completed from the top die 50 to the base 30 as shown in FIG. 6. Overmolding 118 encases the stacked die package in a nonconductive material as shown in FIG. 7. Overmolding may be performed, for example, using a standard transfer molding process. Depending on the type of package and base that has been used, at this point ball attachment to the bottom of the base may be performed in order to provide conductive points for accessing the microelectronics as shown in FIG. 8.

In accordance with embodiments of the invention, an air gap 80 remains disposed between the bottom die and the top die when a wall of adhesive was used to form the adhesive pad. In particular, when a ring of adhesive 11a is formed the air gap 80 is centrally disposed. This relieves that central area of stress associated with an adhesive connection.

Of course, it should be understood that various changes and modifications to the preferred embodiments described above will be apparent to those skilled in the art. For example, a stacked die package in accordance with the invention can be made with a smaller or larger top die with respect to the bottom die. Moreover, the base of the package may be a semiconductor substrate or a lead frame depending upon the desired package. Furthermore, additional layers of dies may be included so that multiple dies are stacked using the described methods. These and other changes can be made without departing from the spirit and scope of the invention and without diminishing its attendant advantages. It is therefore intended that such changes and modifications be covered by the following claims.

What is claimed is:

1. A method for manufacturing stacked dies comprising:
providing a semiconductor wafer having an active surface and a rear surface;
depositing a pattern of adhesive pads on the active surface of the semiconductor wafer;
singulating the wafer into individual first semiconductor dies, each die having an adhesive pad thereon;
attaching the rear surface of each of a plurality of the first semiconductor dies to one of a plurality of bases with a low temperature adhesive; and
curing the low temperature adhesive at a temperature insufficient to fully cure the adhesive pad.

2. The method of claim 1 further comprising partially curing the adhesive pads before singulating the wafer.

3. The method of claim 1 further comprising backgrinding the wafer before depositing the pattern of adhesive.

4. The method of claim 1 further comprising attaching a second semiconductor die atop the adhesive pad on said each first semiconductor die and fully curing the adhesive pad.

5. The method of claim 4 further comprising overmolding a nonconductive material onto each of the first and second semiconductor die stacks.

6. The method of claim 1 wherein each of the adhesive pads has a centrally disposed hollow area.

7. The method of claim 6 wherein each of the adhesive pads comprises a ring of adhesive.

8. A method for manufacturing stacked dies comprising:
   providing a semiconductor wafer having an active surface and a rear surface;
   depositing a pattern of adhesive pads on the active surface of the semiconductor wafer;
   singulating the wafer into individual first semiconductor dies, each die having an adhesive pad thereon;
   attaching the rear surface of each of a plurality of the first semiconductor dies to one of a plurality of bases with a snap cure adhesive; and
   curing the snap cure adhesive without curing the adhesive pad.

9. The method of claim 8 further comprising partially curing the adhesive pads before singulating the wafer.

10. The method of claim 8 further comprising backgrinding the wafer before depositing the pattern of adhesive.

11. The method of claim 8 wherein each of the adhesive pads has a centrally disposed hollow area.

12. The method of claim 11 wherein each of the adhesive pads comprises a ring of adhesive.

13. The method of claim 8 further comprising attaching a second semiconductor die atop the adhesive pad on said each first semiconductor die and fully curing the adhesive pad.

14. The method of claim 13 further comprising overmolding a nonconductive material onto each of the first and second semiconductor die stacks.

* * * * *